United States Patent
Kanazawa

(10) Patent No.: US 7,706,835 B2
(45) Date of Patent: Apr. 27, 2010

(54) HIGH-FREQUENCY CIRCUIT DEVICE

(75) Inventor: Kunihiko Kanazawa, Muko (JP)

(73) Assignee: Panasonic Corporation, Osaka (JP)

( * ) Notice: Subject to any disclaimer, the term of this patent is extended or adjusted under 35 U.S.C. 154(b) by 215 days.

(21) Appl. No.: 12/152,803

(22) Filed: May 16, 2008

(65) Prior Publication Data

US 2008/0233899 A1 Sep. 25, 2008

Related U.S. Application Data

(63) Continuation of application No. 11/058,853, filed on Feb. 15, 2005, now abandoned.

(30) Foreign Application Priority Data

Feb. 27, 2004 (JP) .............................. 2004-054631

(51) Int. Cl.
  *H04M 1/00* (2006.01)
  *H04B 7/212* (2006.01)
(52) U.S. Cl. .................... 455/552.1; 455/102; 370/337; 370/342
(58) Field of Classification Search .............. 455/127.3, 455/552.1, 127.1, 339, 73, 550.1, 572, 102; 370/337, 342, 347
See application file for complete search history.

(56) References Cited

U.S. PATENT DOCUMENTS

| | | | |
|---|---|---|---|
| 4,972,440 | A | 11/1990 | Ernst et al. |
| 5,212,814 | A | 5/1993 | Iwane |
| 5,689,817 | A | 11/1997 | Fok |
| 6,101,224 | A | 8/2000 | Lindoff et al. |
| 6,175,746 | B1 | 1/2001 | Nakayama et al. |
| 6,269,253 | B1 | 7/2001 | Maegawa et al. |
| 6,298,244 | B1 | 10/2001 | Boesch et al. |
| 6,535,499 | B1 | 3/2003 | Futamura et al. |

(Continued)

FOREIGN PATENT DOCUMENTS

CN 1361938 A 7/2002

(Continued)

OTHER PUBLICATIONS

Chinese Office Action for Chinese Patent Application 200510052477.5, dated Jul. 11, 2008.

*Primary Examiner*—Sonny Trinh
(74) *Attorney, Agent, or Firm*—Hamre, Schumann, Mueller & Larson, P.C.

(57) ABSTRACT

A high-frequency circuit device is provided that achieves cost reduction and reduction in power consumption and does not require an additional high-frequency amplifier even when a transmission frequency band is newly added. The high-frequency circuit device has a configuration including a transmission amplifier circuit for transmitting high-frequency power from an antenna, which includes at least one high-frequency amplifier for a wide frequency band that amplifies signals in a plurality of transmission frequency bands differing by not less than 200 MHz from each other, a duplexer that is provided for performing simultaneous transmission/reception, upstream and downstream switch circuits in the direction of transmission that are provided so as to sandwich the duplexer between the high-frequency amplifier for a wide frequency band and the antenna and are switched on when the simultaneous transmission/reception is performed, and a power supply amplitude modulator that supplies an amplitude modulation voltage to a power supply terminal of the transmission amplifier circuit.

12 Claims, 8 Drawing Sheets

U.S. PATENT DOCUMENTS

| | | |
|---|---|---|
| 6,567,653 B1 | 5/2003 | Sanders |
| 6,665,525 B2 | 12/2003 | Dent et al. |
| 6,751,803 B1 | 6/2004 | Matsuura |
| 6,804,500 B2 | 10/2004 | Yamaguchi |
| 6,853,836 B2 | 2/2005 | Asam et al. |
| 6,906,592 B2 | 6/2005 | Barnett et al. |
| 6,992,990 B2 | 1/2006 | Sakusabe |
| 7,157,985 B2 * | 1/2007 | Mitani et al. ................ 332/119 |
| 7,209,717 B2 | 4/2007 | Okada et al. |
| 7,215,215 B2 * | 5/2007 | Hirano et al. ............... 332/128 |
| 7,269,156 B2 | 9/2007 | Kanazawa |
| 7,324,787 B2 | 1/2008 | Kurakami et al. |
| 7,457,592 B2 * | 11/2008 | Arayashiki .................. 455/108 |
| 7,565,118 B2 * | 7/2009 | Hara ......................... 455/108 |
| 2002/0049075 A1 | 4/2002 | Takagi |
| 2002/0090974 A1 | 7/2002 | Hagn |
| 2004/0047306 A1 | 3/2004 | Katagishi et al. |
| 2004/0097210 A1 | 5/2004 | Sato |
| 2006/0245517 A1 * | 11/2006 | Ikedo et al. ................ 375/297 |

FOREIGN PATENT DOCUMENTS

| | | |
|---|---|---|
| JP | 61-105101 | 5/1986 |
| JP | 2-180453 | 7/1990 |
| JP | 3-198513 | 8/1991 |
| JP | 9-232992 | 9/1997 |
| JP | 2002-135157 A | 5/2002 |
| JP | 2002-208869 A | 7/2002 |
| JP | 2002-325049 | 11/2002 |
| WO | WO 00/70746 | 11/2000 |
| WO | WO 01/80436 | 10/2001 |
| WO | WO 03/071699 | 8/2003 |
| WO | WO 2004/002098 | 12/2003 |

* cited by examiner ical apparatus such as a mobile phone or the like. More specifically, this invention relates to a multiband high-frequency circuit device including a semiconductor amplifier circuit (hereinafter, referred to as a transmission amplifier circuit) for high-frequency power transmission and a switch circuit for switching among a plurality of frequency bands.

HIGH-FREQUENCY CIRCUIT DEVICE

This application is a continuation of U.S. application Ser. No. 11/058,853, filed Feb. 15, 2005, which application is incorporated herein by reference.

BACKGROUND OF THE INVENTION

1. Field of the Invention

The present invention relates to a high-frequency circuit device in a transmission/reception part of a high-frequency radio set, specifically, a mobile communication apparatus such as a mobile phone or the like. More specifically, this invention relates to a multiband high-frequency circuit device including a semiconductor amplifier circuit (hereinafter, referred to as a transmission amplifier circuit) for high-frequency power transmission and a switch circuit for switching among a plurality of frequency bands.

2. Description of the Related Art

Under a system according to a W-CDMA (Wideband-Code Division Multiple Access) system or a CDMA (Code Division Multiple Access) system such as is used for a mobile phone or the like, some types of mobile phones use a plurality of frequency bands including frequency bands that differ by not less than 200 MHz from each other, for example, 2 GHz in combination with 1.7 GHz, the frequency band of 1.4 to 1.5 GHz, or the frequency band of 800 to 900 MHz. In such a mobile phone, a transmission amplifier circuit that transmits high-frequency power from an antenna is configured using separate high-frequency amplifiers with respect to the respective frequency bands for the following reason. That is, when a conventional linear high-frequency amplifier that receives a quadrature modulation signal is operated to perform a linear amplification operation on a wide frequency band, the current consumption increases considerably.

Furthermore, in the case where a wireless LAN (Local Area Network) function is imparted to a mobile phone, not only because this function is added but also because frequencies in the frequency band of 2.4 GHz and the frequency band of 5 GHz are used in this case, the number of high-frequency amplifiers to be used should be increased by the number of the frequency bands, which has been disadvantageous.

CONVENTIONAL EXAMPLE 1

FIG. 6 is a block diagram showing an example of the configuration of a conventional high-frequency circuit device. As shown in FIG. 6, a W-CDMA transmission signal Tx (0.8) in the frequency band of 800 MHz to 900 MHz is input to a high-frequency amplifier 1 of a transmission-amplifier circuit and amplified. Further, a W-CDMA transmission signal Tx (2) in the frequency band of 1.9 GHz to 2.0 GHz is input to a high-frequency amplifier 2 of the transmission amplifier circuit and amplified.

After these transmission signals in the plurality of frequency bands are amplified by the high-frequency amplifiers 1 and 2, respectively, signals of second-, third- and higher order harmonic components of the transmission signals are removed by low-pass filters (LPF), and the transmission signals without the harmonic components are input to duplexers (shared devices) 9 and 9 via isolators 27 and 27, respectively. The duplexers 9 and 9 are filters for separating signals into a transmission signal and a reception signal so as to enable simultaneous transmission/reception. Further, the isolators 27 are used to avoid the deterioration of a distortion characteristic in operations of the high-frequency amplifiers 1 and 2, which might result from an impedance that deviates from 50 ohms when an antenna 7 is brought close to metal or a human head.

Furthermore, a multi-switch circuit 8 for switching among transmission frequency bands is connected between the antenna 7 and the duplexers 9 so as to select a transmission frequency band and supply the antenna 7 with signals in the transmission frequency band. On the other hand, when reception is performed, the multi-switch circuit 8 selects a reception frequency band. Then, reception signals are supplied from the antenna 7 to the duplexers 9 and 9 via the multi-switch circuit 8 and are received as a reception signal Rx (0.8) and an Rx signal (2) via SAW filters (SAW) 11 and 11 and low-noise amplifiers (LNA) 12 and 12, respectively. Instead of using the SAW filters 11, the reception side of each of the duplexers 9 may be configured as one filter. The multi-switch circuit 8 using a high frequency is formed of a GaAs switch. The multi-switch circuit 8 also may be formed of a pin diode.

CONVENTIONAL EXAMPLE 2

FIG. 7 is a block diagram showing an example of the configuration of a conventional high-frequency circuit device including high-frequency amplifiers with respect to three frequency bands. As shown in FIG. 7, in Conventional Example 2, in addition to the transmission signals described in Conventional Example 1, a W-CDMA transmission signal Tx (1.7) at a frequency of 1.7 GHz is input to a high-frequency amplifier 30 and amplified. In the same manner as in the cases of the frequency band of 2 GHz and the frequency band of 800 to 900 MHz, after the transmission signal Tx (1.7) is amplified by the high-frequency amplifier 30, signals of second-, third- and higher order harmonic components of the transmission signal Tx (1.7) are removed by a low-pass filter (LPF), and the transmission signal Tx (1.7) without the harmonic components is input to a duplexer (shared device: DUP) 9 for performing simultaneous transmission/reception via an isolator 27.

Furthermore, in the same manner as in Conventional Example 1, a multi-switch circuit 8 for switching among transmission frequency bands is connected between an antenna 7 and the duplexer 9 so as to select a transmission frequency band and supply the antenna 7 with signals in the transmission frequency band. On the other hand, when reception is performed, the multi-switch circuit 8 selects a reception frequency band. Then, a reception signal is supplied from the antenna 7 to the duplexer 9 via the multi-switch circuit 8 and is received as a reception signal Rx (1.7) via a SAW filter (SAW) 11 and a low-noise amplifier (LNA) 12.

Herein, the high-frequency amplifiers 1, 2 and 30 are formed of a FET or HBT (heterobipolar transistor) that is made from GaAs, or a HBT made from SiGe.

CONVENTIONAL EXAMPLE 3

FIG. 8 is a block diagram showing an example of the configuration of a conventional high-frequency circuit device that includes high-frequency amplifiers with respect to three frequency bands and conforms to a wireless LAN (Local Area Network).

In the case where a signal of the wireless LAN that has been modulated by multi-carrier modulation for OFDM (Orthogonal Frequency Division Multiplex) or the like is transmitted by this system, due to a difference in frequency and operation, a high-frequency amplifier 30 for a wireless LAN with the frequency band of 2.4 GHz is required in addition to high-frequency amplifiers 1 and 2 for W-CDMA. This is not only because there is a difference in frequency but also because a resultant output is as small as about one-tenth to one-hundredth of that of a mobile phone, and thus when a high-frequency amplifier for a mobile phone is used as the high-frequency amplifier 30 in linear operation, to which a 2.4 GHz wireless LAN signal Tx (2.4) that is a quadrature modulation signal similar to that used in the case of the W-CDMA is input, current consumption increases as much as five- to ten-fold. In a wireless LAN operation, a selection is made between transmission and reception operations by a multi-switch circuit, and when reception is performed, a reception signal Rx (2.4) is output from a low-noise reception amplifier 12 for a wireless LAN.

The above-described configuration used for a wireless LAN also applies to the case where a signal in the frequency band of 2.4 GHz to 2.7 GHz according to the W-CDMA, TD-CDMA, or TD-SCDMA system exists.

However, in such a configuration according to the conventional technique, when using two, three, four or a higher number of frequency bands according to the W-CDMA system, the number of high-frequency amplifiers to be used should be increased so as to correspond to the number of the frequency bands. Therefore, compared with the conventional case of a mobile phone using one or two frequency bands, this case leads to a two- to three-fold cost increase, and since isolators should be provided with respect to the respective frequency bands, the cost further is increased. This ends up in a nearly three- to five-fold cost increase, which has been disadvantageous.

Furthermore, since the isolators are provided, an electric current to be consumed in the high-frequency amplifiers for the W-CDMA also is lost by about 20%, resulting in an extra current consumption of 40 to 70 mA, which is disadvantageous.

Furthermore, when a wireless LAN function is added, a high-frequency amplifier for a wireless LAN is required additionally, which has been disadvantageous.

SUMMARY OF THE INVENTION

With the foregoing in mind, it is an object of the present invention to provide a high-frequency circuit device that achieves cost reduction and reduction in power consumption and does not require an additional high-frequency amplifier even when a transmission frequency band is newly added.

In order to achieve the above-mentioned object, a high-frequency circuit device according to the present invention is a high-frequency circuit device that is conformable to the W-CDMA or CDMA system in which a plurality of transmission frequency bands exist. The high-frequency circuit device has a configuration including a transmission amplifier circuit for transmitting high-frequency power from an antenna, which includes at least one high-frequency amplifier for a wide frequency band that amplifies signals in a plurality of transmission frequency bands differing by not less than 200 MHz from each other, a duplexer that is provided for performing simultaneous transmission/reception, upstream and downstream switch circuits in the direction of transmission that are provided so as to sandwich the duplexer between the high-frequency amplifier for a wide frequency band and the antenna and are switched on when the simultaneous transmission/reception is performed, and a power supply amplitude modulator that supplies an amplitude modulation voltage to a power supply terminal of the transmission amplifier circuit. Further, in the high-frequency amplifier of the transmission amplifier circuit, phase information of a transmission signal is supplied to a signal input terminal and an amplitude modulation voltage corresponding to amplitude information of the transmission signal is supplied from the power supply amplitude modulator to the power supply terminal so that polar modulation or polar loop modulation is performed.

According to the above-described configuration, a high-frequency circuit device for a mobile phone that is conformable to two, three, four or a higher number of frequency bands according to the W-CDMA system can be realized using high-frequency amplifiers reduced in number to as few as one or two. Further, there is no need to provide isolators so as to correspond to the respective frequency bands, and thus the cost of a high-frequency amplifier and an isolator can be reduced to one-third to one-fifth. Further, a loss caused by an isolator can be eliminated, and thus current consumption of a high-frequency amplifier in a W-CDMA operation can be reduced by about 20%, namely, by 40 to 70 mA.

Furthermore, the addition of a wireless LAN function also can be realized in the following manner. That is, a high-frequency amplifier for a wide frequency band amplifies a signal in a transmission frequency band corresponding to a wireless LAN and directly supplies the signal that has been amplified to a downstream switch circuit in the direction of transmission, and polar modulation or polar loop modulation is performed.

According to the present invention, a high frequency circuit device can be provided that achieves cost reduction (to one-third to one-fifth) and reduction in power consumption (about 20% decrease) and does not require an additional high-frequency amplifier even when a transmission frequency band is newly added, thereby providing a substantial effect.

DESCRIPTION OF THE PREFERRED EMBODIMENTS

Hereinafter, the present invention will be described by way of preferred embodiments with reference to the appended drawings.

First Embodiment

Figure 1:
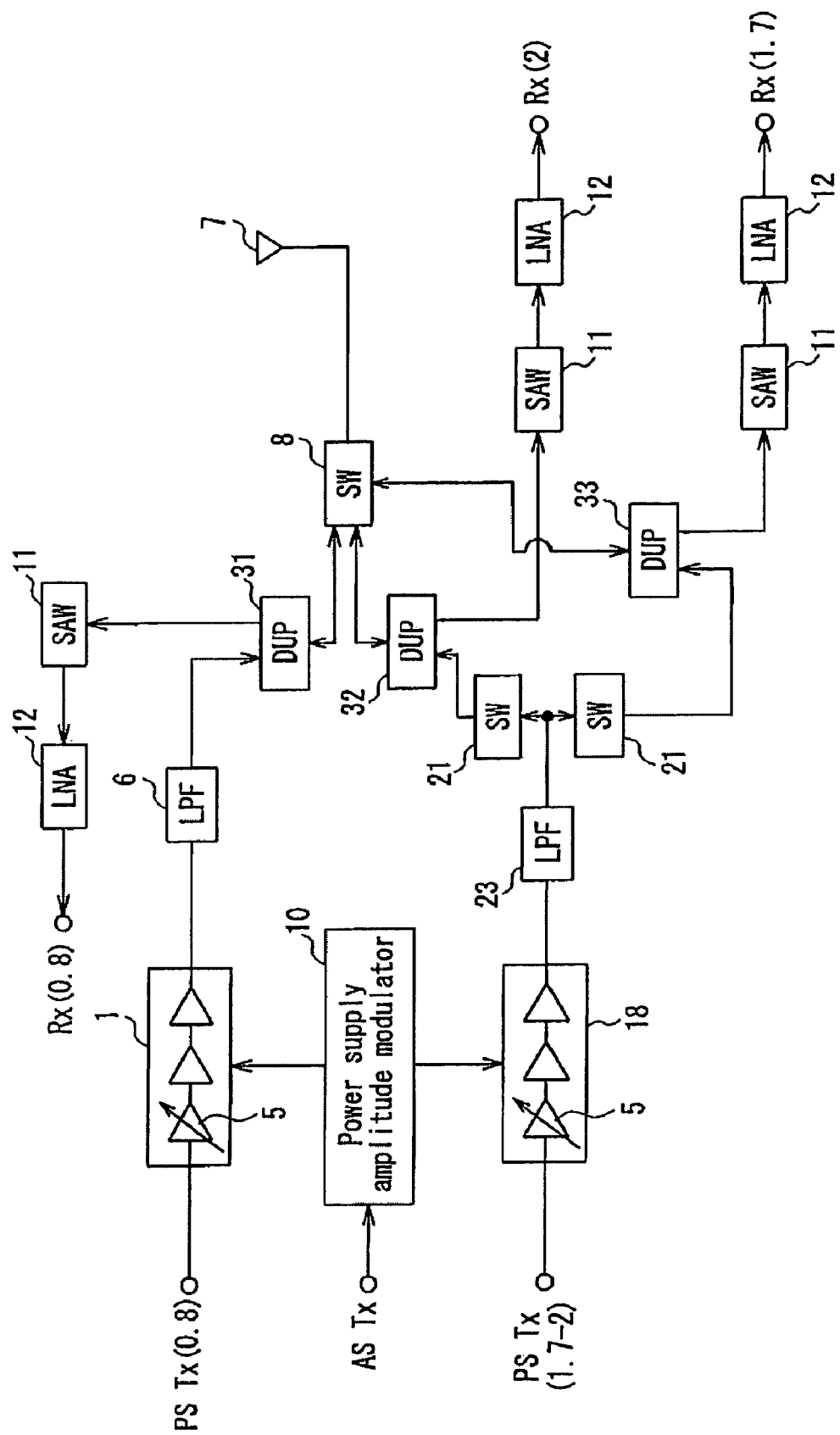
FIG. 1 is a block diagram showing an example of the configuration of a high-frequency circuit device according to a first embodiment of the present invention.

FIG. 1 is a block diagram showing an example of the configuration of a high-frequency circuit device according to a first embodiment of the present invention.

Firstly, as shown in FIG. 1, in the high-frequency circuit device according to this embodiment, an amplitude modulation voltage corresponding to an amplitude signal AS Tx is supplied from a power supply amplitude modulator 10 to a power supply terminal of each of high-frequency amplifiers 1 and 18 that constitute a transmission amplifier circuit. Basically, the high-frequency amplifiers 1 and 18 perform a polar modulation or polar loop modulation operation.

In other words, in comparison with a conventional example that is realized by a conventional quadrature modulation operation and uses, along with isolators, high-frequency amplifiers in linear operation that respectively operate with respect to a plurality of transmission signal frequency bands, this embodiment has the following configuration. That is, firstly, all of the W-CDMA operations are performed based on polar modulation or polar loop modulation. To this end, a phase signal is input to a high-frequency amplifier, and an amplitude modulation voltage further is input to its power supply terminal. Thus, it is no longer necessary to provide a conventional linear amplifier. Further, the high-frequency amplifier in polar modulation operation can be realized by a high-frequency amplifier in saturation operation, and thus a high-frequency amplifier that is conformable to an extremely wide frequency band can be realized.

Moreover, polar modulation can be realized by designing the power supply amplitude modulator 10 in a high frequency operation with the current semiconductor technology using higher frequencies and a duplexer (shared device) so as to avoid an influence on other frequencies when removing an isolator that will be described later.

Hereinafter, the high-frequency circuit device according to this embodiment will be described specifically.

In FIG. 1, a phase signal PS Tx (0.8) in the frequency band of 800 to 900 MHz according to the W-CDMA system is amplified by the high-frequency amplifier 1. Meanwhile, a phase signal PS Tx (1.7-2) in the frequency band of 1,700 to 2,100 MHz according to the W-CDMA system is amplified by the high-frequency amplifier 18 for a wide frequency band. By polar modulation or polar loop modulation, a high-frequency amplifier in saturation operation, which is conformable to such a wide frequency band, can be realized. Further, in each of the high-frequency amplifiers 1 and 18, a gain-controllable driver amplifier 5 is housed to perform dynamic range expansion according to the W-CDMA system. Further, in order to perform polar modulation, an amplitude modulation voltage corresponding to amplitude information of a transmission signal is input from the power supply amplitude modulator 10 to the power supply terminal of each of the high-frequency amplifiers 1 and 18.

Output signals of the high-frequency amplifier 18 are input to duplexers 32 and 33 via upstream switch circuits 21 and 21 in the direction of transmission, respectively. The duplexers are filters for separating signals according to their frequency bands so as to perform transmission and reception simultaneously. When an antenna 7 is brought close to metal or a human head, an impedance deviates from 50 ohms and thus might result in the deterioration of a distortion characteristic in a W-CDMA operation of the high-frequency amplifier 18. Such deterioration can be avoided by a polar modulation operation. In addition to this, in order to avoid an adverse effect such as the generation of a disturbing wave in another frequency band caused by backflow of a transmission signal and a reception signal, which originate respectively in another mobile phone and a base station, from the antenna 7 to the high-frequency amplifiers 1 and 18, the duplexers 31, 32 and 33 have the following configuration. That is, when each of signals in the frequency bands of, for example, 800 to 900 MHz or 900 to 1,000 MHz, 1.7 GHz, and 2 GHz or 1.9 to 2 GHz from the high-frequency amplifiers is passed, originally, a selection is made among the duplexers 31, 32 and 33 by the upstream switch circuits 21 in the direction of transmission. In this case, the duplexers 31, 32 and 33 also are provided with a blocking characteristic of suppressing signals at a frequency differing by not less than 200 MHz from that of a signal in a transmission frequency band. Thus, by this suppressing function that is fulfilled conventionally by an isolator, a configuration without an isolator can be realized, and polar modulation or polar loop modulation can be performed.

For example, the duplexer 33 for a frequency of 1.7 GHz suppresses an external transmission signal at a frequency of 1.4 to 1.5 GHz that originates in another mobile phone and enters from the antenna 7, and prevents a phenomenon in which a disturbing signal in the vicinity of the frequency band of 2 GHz generated when a transmission signal in the frequency band of 1.7 GHz is output by the high-frequency amplifier 18 is emitted from the antenna 7 to disturb a reception signal and a transmission signal in the frequency band of 2 GHz of another mobile phone.

Alternatively, for example, the duplexer 33 for a frequency of 1.7 GHz suppresses an external transmission signal at a frequency of 0.2 to 2.1 GHz that originates in another mobile phone and enters from the antenna 7, and prevents a phenomenon in which a disturbing signal in the vicinity of the frequency band of 1.4 to 1.5 GHz generated when a transmission signal at a frequency of 1.7 GHz is output by the high-frequency amplifier 18 is emitted from the antenna 7 to disturb a reception signal and a transmission signal of another mobile phone in the frequency band of 1.4 to 1.5 GHz.

Moreover, a downstream switch circuit (multi-switch) 8 in the direction of transmission for selecting a frequency band for transmission/reception is provided between the antenna 7 and the duplexers 32 and 33 so as to enable switching. The upstream switch circuits 21 and the downstream switch circuit 8 are formed of a high-frequency switch (SW) made from GaAs. Further, this high-frequency switch also may be formed of a pin diode. Further, low-pass filters (LPF) 6 and 23 are used to suppress harmonics from the high-frequency amplifiers 1 and 18. The high-frequency amplifiers 1 and 18 are formed of a FET or HBT (heterobipolar transistor) that is made from GaAs or a HBT made from SiGe. Further, the high-frequency amplifiers 1 and 18 may be saturation amplifiers and thus may be formed of a MOS FET or bipolar transistor that is made from silicon.

When reception is performed, surface-acoustic-wave (SAW) filters 11 are used to limit a frequency. However, the duplexers 31, 32 and 33 may be provided with an enhanced filtering characteristic so as to serve as SAW filters also.

Figure 7:
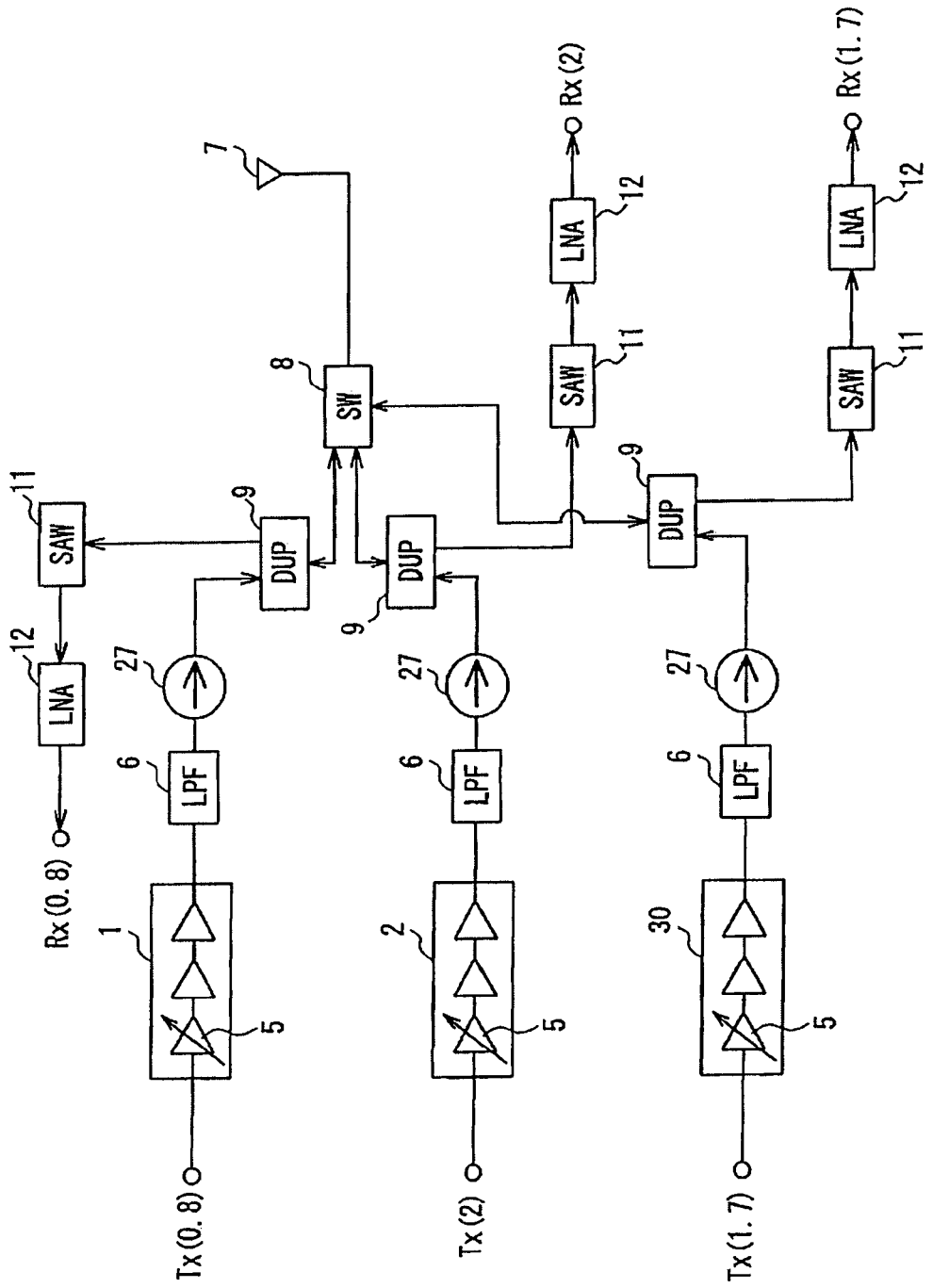
FIG. 7 is a block diagram showing an example of the configuration of a high-frequency circuit device according to Conventional Example 2.
Figure 8:
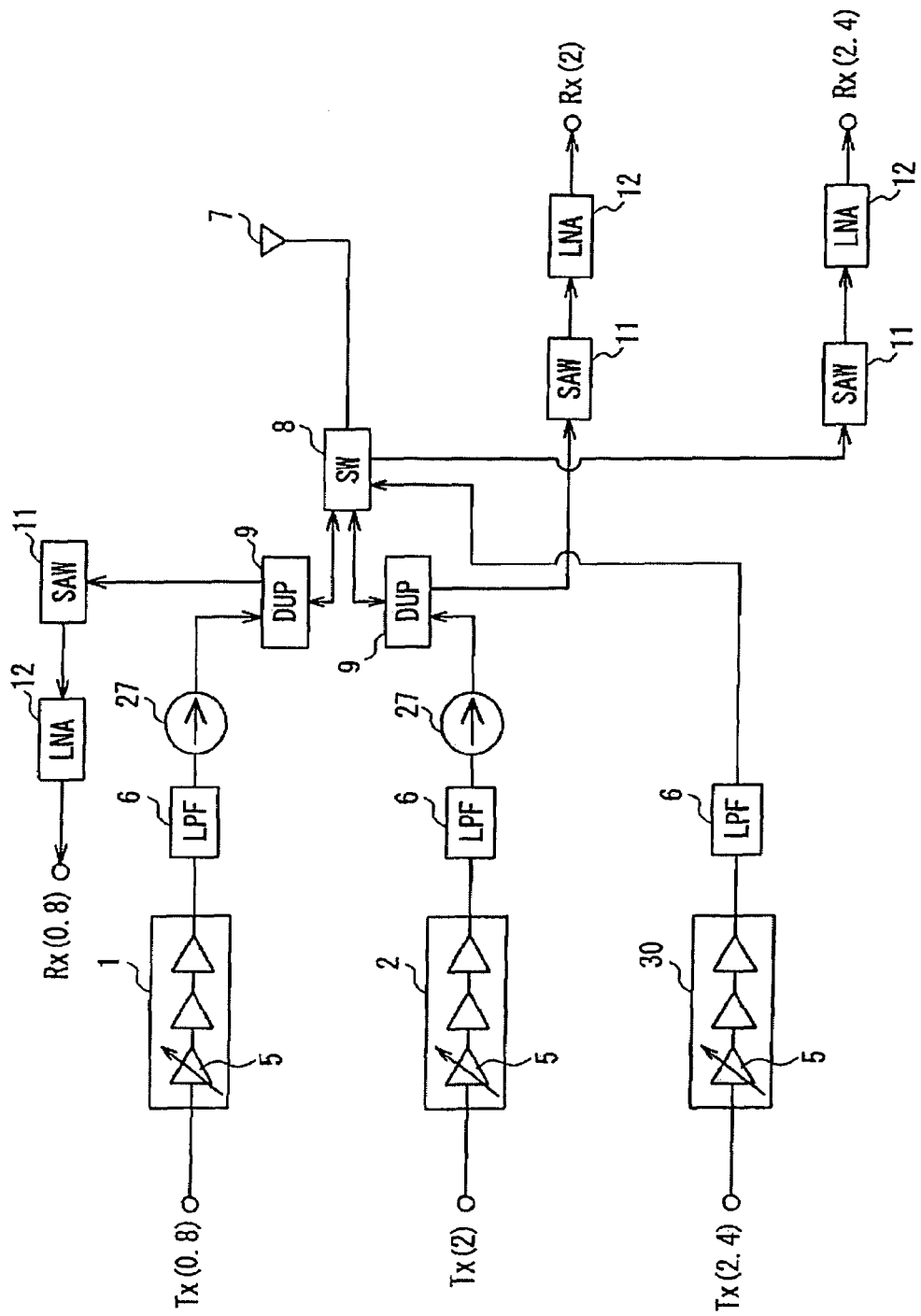
FIG. 8 is a block diagram showing an example of the configuration of a high-frequency circuit device according to Conventional Example 3.

As described above, according to this embodiment, compared with Conventional Example 2 shown in FIG. 7, the number of high-frequency amplifier circuits to be used can be reduced from three to two, and the need to provide an isolator further can be eliminated, and thus a cost reduction by nearly half can be achieved. Further, since an isolator is not provided, an output loss can be reduced, and by polar modulation, a saturation operation can be performed. Thus, an electric current consumed in a high-frequency amplifier in a CDMA operation according to the W-CDMA or the like can be reduced by as much as about 30% to 80%.

Second Embodiment

Figure 2:
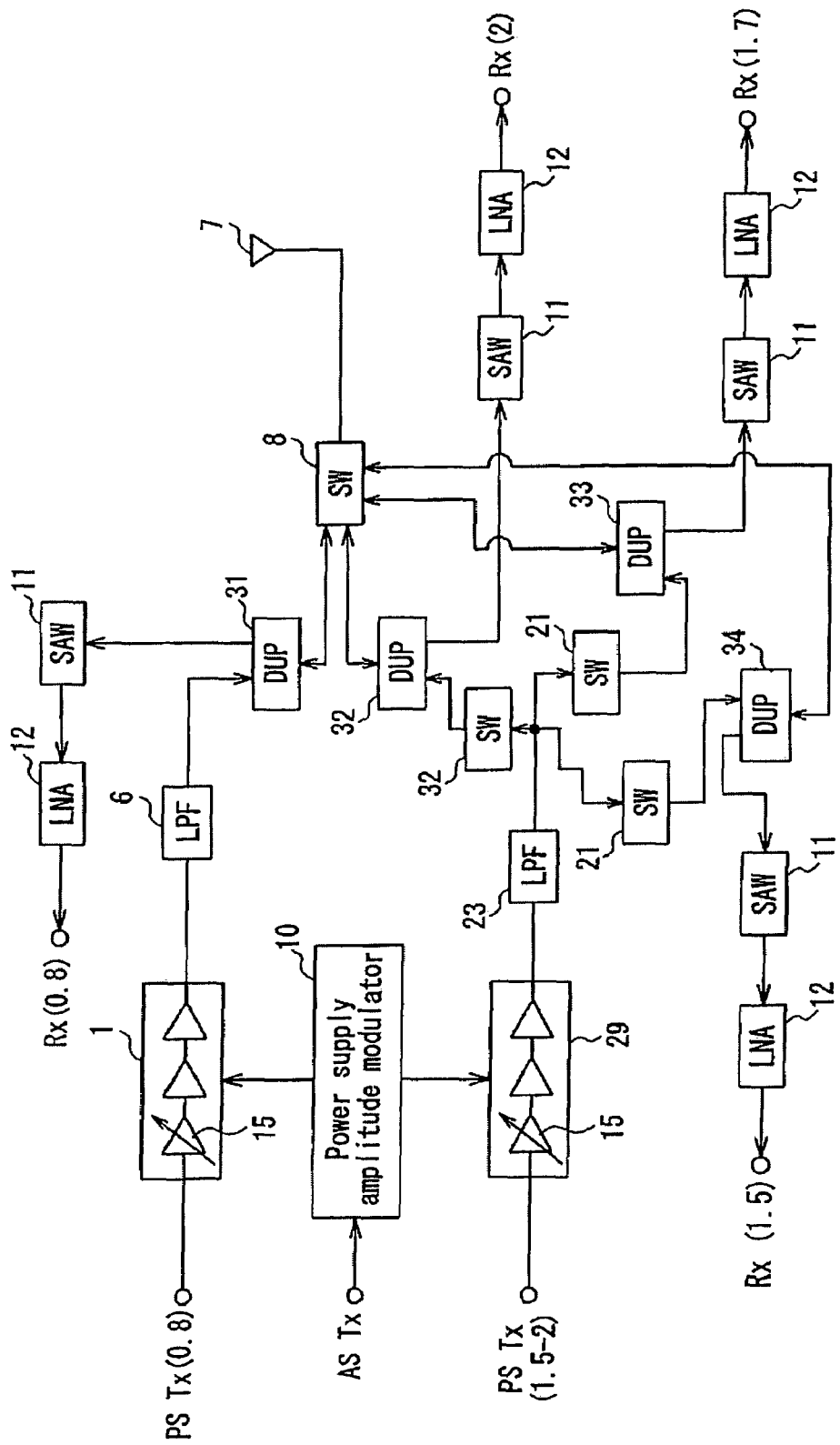
FIG. 2 is a block diagram showing an example of the configuration of a high-frequency circuit device according to a second embodiment of the present invention.

FIG. 2 is a block diagram showing an example of the configuration of a high-frequency circuit device according to a second embodiment of the present invention.

As shown in FIG. 2, with respect to the first embodiment, this embodiment is intended to represent the case of further including the W-CDMA in the frequency band of 1.4 GHz to 1.5 GHz. In this embodiment, a high-frequency amplifier for a wide frequency band whose saturation characteristic is utilized to enable an operation on a wider frequency band is used as a high-frequency amplifier 29 in operation on the frequency band of 1.5 GHz to 2 GHz. A phase signal PS Tx (1.5-2) in the frequency band of 1.5 to 2 GHz is input to the high-frequency amplifier 29.

Furthermore, between an antenna 7 and the high-frequency amplifier 29, a duplexer 34 is provided so as to be sandwiched between an upstream switch circuit 21 and a downstream switch circuit (multi-switch) 8 in the direction of transmission. In this case, the duplexer 34 for a frequency of 1.5 GHz suppresses an external transmission signal in the frequency band of 800 to 900 GHz that originates in another mobile phone and enters from the antenna 7, and prevents a phenomenon in which a disturbing signal in the vicinity of a frequency of 2 GHz generated when a transmission signal at a frequency of 1.4 to 1.5 GHz is output from the high-frequency amplifier 29 is emitted from the antenna 7 to disturb a reception signal and a transmission signal of another mobile phone in the frequency band of 2 GHz.

As described above, according to this embodiment, the number of high-frequency amplifiers to be used, which was four in a conventional case, can be reduced to two, and the need to provide an isolator further can be eliminated, and thus a cost reduction to about not more than one-third can be achieved. Further, since an isolator is not provided, an output loss can be reduced, and by polar modulation, a saturation operation can be performed. Thus, an electric current consumed in a high-frequency amplifier in a CDMA operation according to the W-CDMA or the like can be reduced by as much as about 30% to 80%.

Third Embodiment

Figure 3:
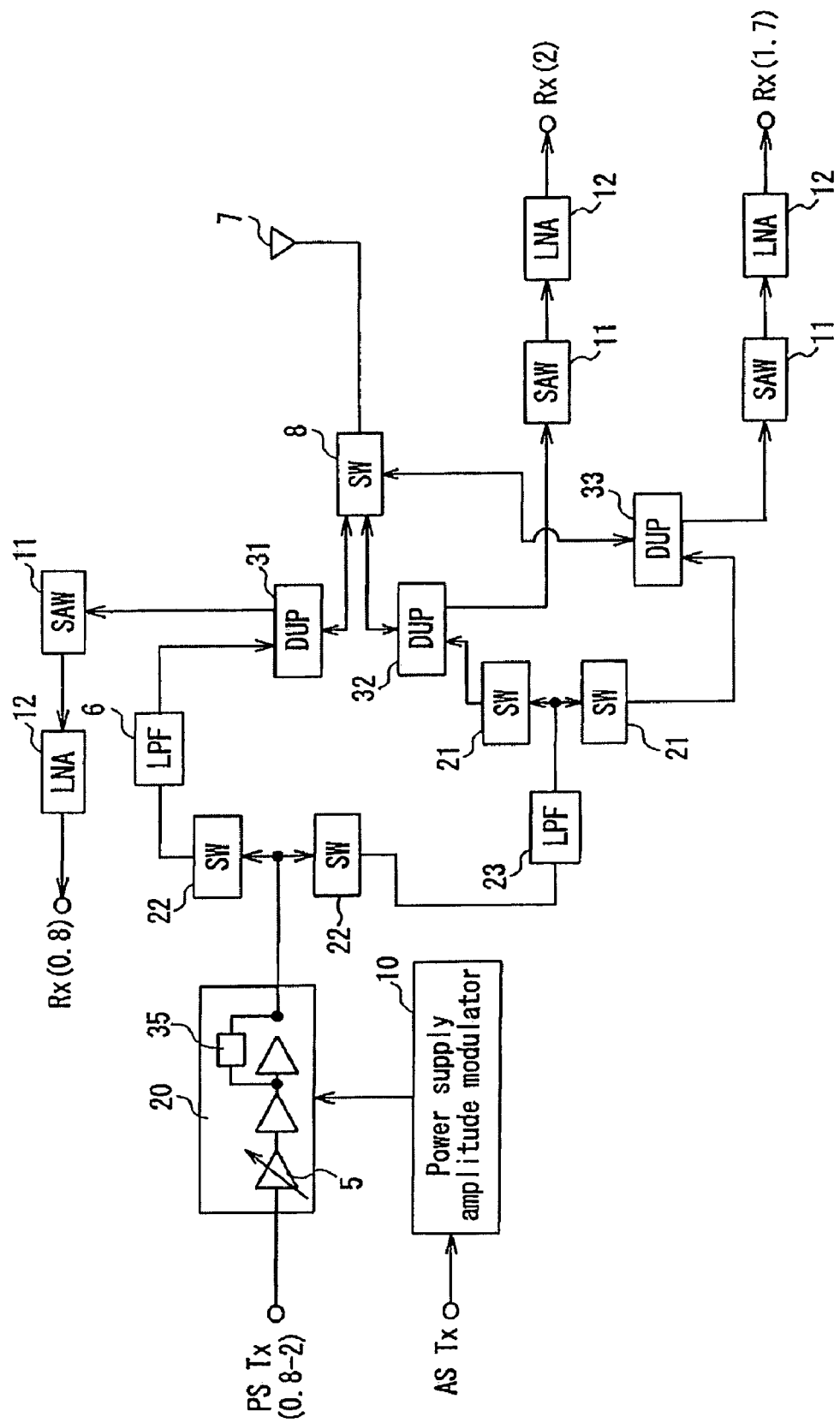
FIG. 3 is a block diagram showing an example of the configuration of a high-frequency circuit device according to a third embodiment of the present invention.

FIG. 3 is a block diagram showing an example of the configuration of a high-frequency circuit device according to a third embodiment of the present invention.

Firstly, as shown in FIG. 3, compared with the first embodiment, this embodiment is intended to represent the case where all modes according to the W-CDMA in the frequency band of 800 MHz to 2 GHz further are realized using one high-frequency amplifier 20. In this embodiment, a feedback circuit 35 is housed in a final amplification stage of the high-frequency amplifier 20, thereby enabling an operation on a wider frequency band of 800 MHz to 2 GHz. Generally, the feedback circuit 35 is formed of a resistance component and a direct-current cutting capacitor. A phase signal PS Tx (0.8-2) in the frequency band of 800 MHz to 2 GHz is input to the high-frequency amplifier 20.

Furthermore, between an antenna 7 and the high-frequency amplifier 20, each of duplexers 31, 32 and 33 with the respective frequency bands is provided so as to be sandwiched between each upstream switch circuit 21 and a downstream switch circuit (multi-switch) 8 in the direction of transmission.

As described above, according to this embodiment, the number of high-frequency amplifiers to be used, which was three in a conventional case, can be reduced to one, and the need to provide an isolator further can be eliminated, and thus a cost reduction to about not more than one-fourth can be achieved. Further, since an isolator is not provided, an output loss can be reduced, and by polar modulation, a saturation operation can be performed. Thus, an electric current consumed in a high-frequency amplifier in a CDMA operation according to the W-CDMA or the like can be reduced by as much as about 30% to 80%.

Not to mention, even in the case where an expanded frequency band of 2.5 to 2.7 GHz is used according to the W-CDMA or the case where TD-CDMA or TD-SCDMA is employed instead of the W-CDMA, the same configuration can be realized by using a high-frequency amplifier with the frequency band of 800 MHz to 2.7 GHz.

Fourth Embodiment

Figure 4:
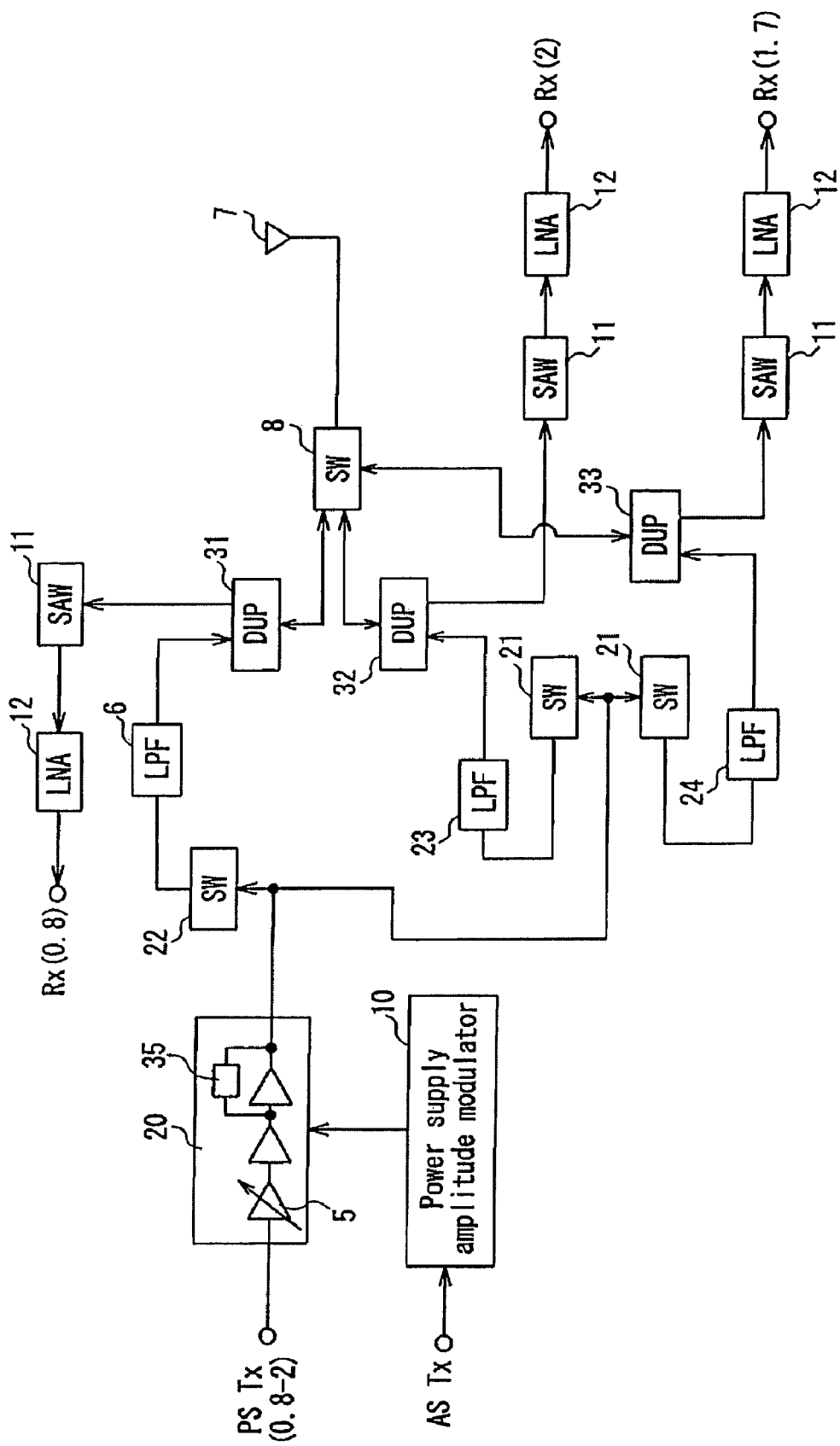
FIG. 4 is a block diagram showing an example of the configuration of a high-frequency circuit device according to a fourth embodiment of the present invention.

FIG. 4 is a block diagram showing an example of the configuration of a high-frequency circuit device according to a fourth embodiment of the present invention.

In the third embodiment shown in FIG. 3, a low-pass filter (LPF) 23 attenuated second- and third-order harmonic components of transmission signals in the frequency bands of 1.7 GHz and 2 GHz so as to suppress signals at frequencies about not lower than 3 GHz sufficiently. However, the transmission signals in the frequency bands of 1.7 GHz and 2 GHz from the high-frequency amplifier 20 pass through two switch circuits, i.e. switch circuits 22 and 21 before reaching the duplexers 33 and 32, respectively, resulting in a large loss.

With respect to this problem, in this embodiment, as shown in FIG. 4, a low-pass filter (LPF) 24 with the frequency band of 1.7 GHz and a low-pass filter (LPF) 23 with the frequency band of 2 GHz are arranged between a switch circuit 21 and a duplexer 33 and between a switch circuit 21 and a duplexer 32, respectively, and are provided with characteristics of attenuating second- and third-order harmonic components of a transmission signal in the frequency band of 1.7 GHz and a transmission signal in the frequency band of 2 GHz, respectively. Thus, transmission signals in the frequency bands of 1.7 GHz and 2 GHz from a high-frequency amplifier 20 pass through only one switch circuit, i.e. a switch circuit 21, before reaching the duplexers 33 and 32, respectively, thereby allowing a loss to be reduced by 0.2 dB to 0.3 dB. As described above, according to this embodiment, the number of high-frequency amplifiers to be used, which was three in a conventional case, can be reduced to one, and the need to provide an isolator further can be eliminated, and thus a cost reduction to about not more than one-fourth can be achieved. Moreover, with respect to the third embodiment, an output loss of a high-frequency amplifier with respect to the frequency bands of 1.7 GHz and 2 GHz can be reduced by about 10%, thereby allowing an electric current consumed in the high-frequency amplifier to be reduced further by as much as about 10%.

The third and fourth embodiments described the cases in which the W-CDMA in the frequency band of 1.4 to 1.5 GHz is not used. Needless to say, the case of using the above frequency band can be realized in the following manner. That is, as shown in FIG. 2, a circuit including a duplexer for the frequency band of 1.4 to 1.5 GHz is added between the high-frequency amplifier and an antenna.

Fifth Embodiment

Figure 5:
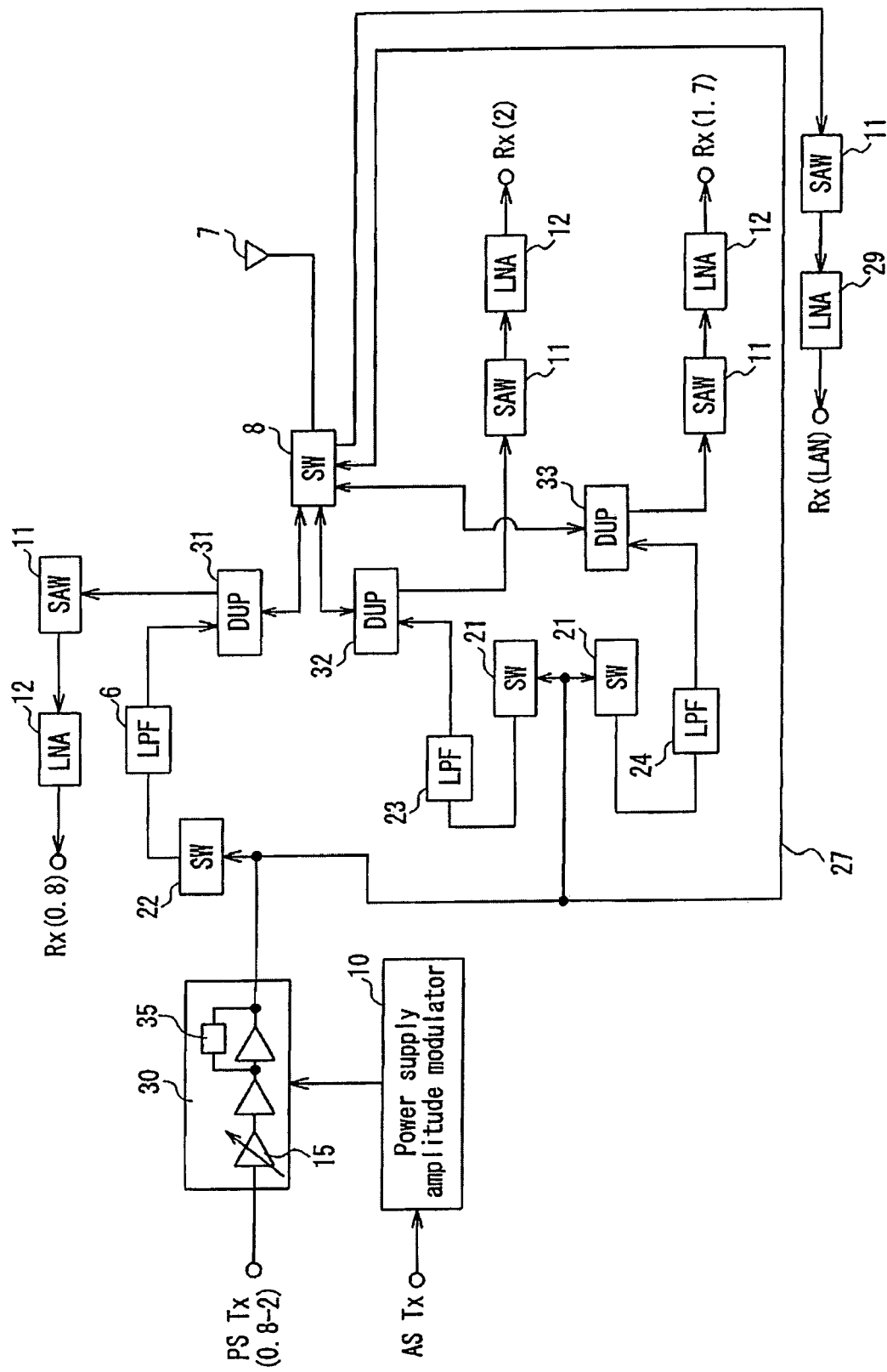
FIG. 5 is a block diagram showing an example of the configuration of a high-frequency circuit device according to a fifth embodiment of the present invention.
Figure 6:
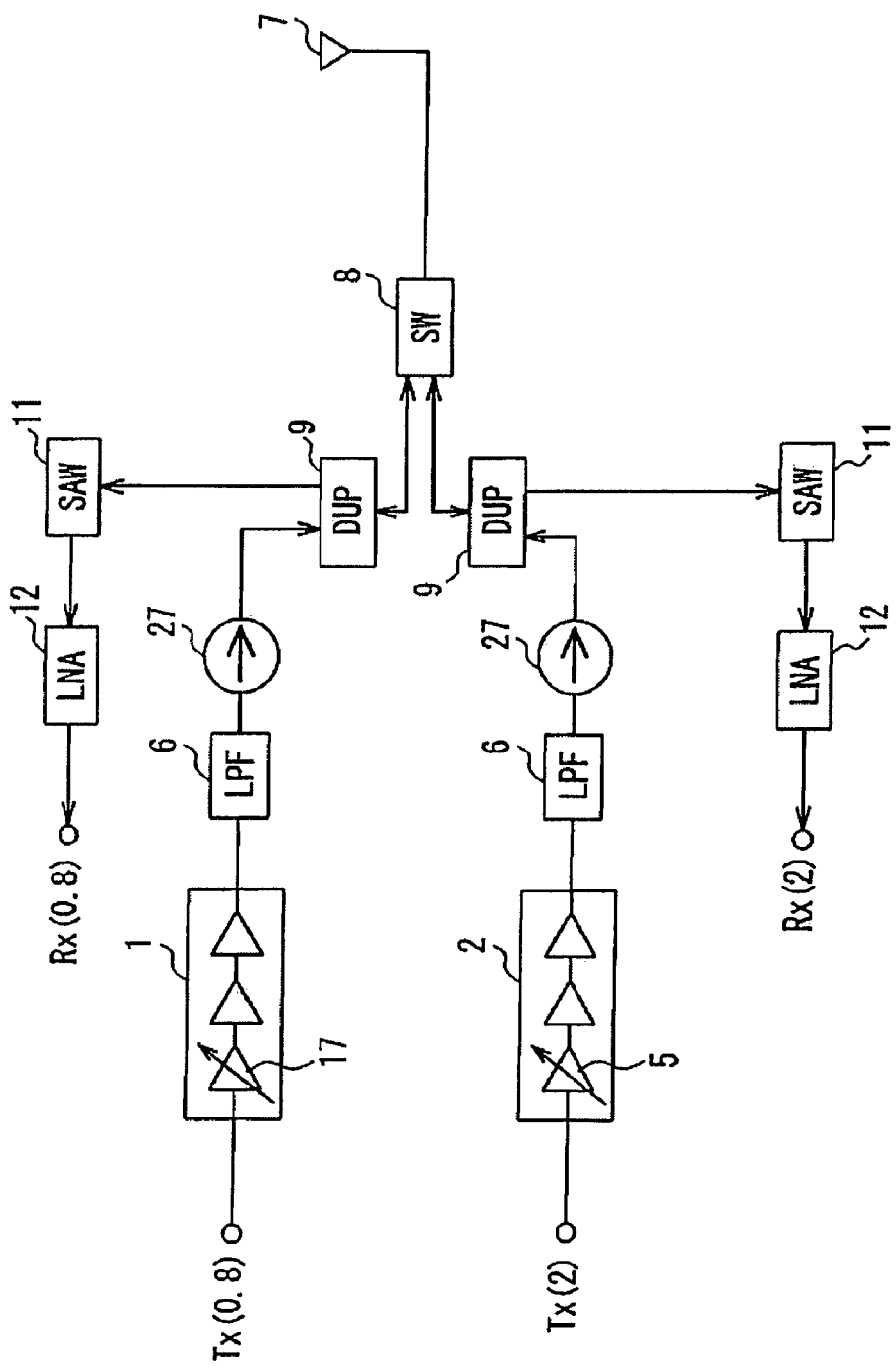
FIG. 6 is a block diagram showing an example of the configuration of a high-frequency circuit device according to Conventional Example 1.

FIG. 5 is a block diagram showing an example of the configuration of a high-frequency circuit device according to a fifth embodiment of the present invention.

As shown in FIG. 5, with respect to the first to fourth embodiments, in the case where a signal of a wireless LAN that has been modulated by multi-carrier modulation for OFDM (Orthogonal Frequency Division Multiplex) or the like is transmitted to a mobile phone by this system, due to a difference in frequency and operation, a resultant output is one-tenth to one-hundredth of a transmission output of a mobile phone in a W-CDMA operation. However, by control using an amplitude of a power supply amplitude modulator 10, this case can be realized using the same high-frequency amplifier based on polar modulation or polar loop modulation. In this case, in this embodiment, a transmission signal path 27 for a wireless LAN for directly supplying an output signal of a high-frequency amplifier 30 to a downstream switch circuit (multi-switch) 8 in the direction of transmission is provided, and thus communication is enabled by switching of the multi-switch 8. Moreover, a reception amplifier 29 for a wireless LAN is connected to the multi-switch 8 via a SAW filter 11, by which a reception signal Rx (LAN) is received when wireless LAN reception is performed.

In this case, a duplexer 33 for a frequency of 1.7 GHz suppresses an external transmission signal in the frequency band of 800 to 900 MHz or the frequency band of 900 to 1,000 MHz that originates in another mobile phone and enters from an antenna 7, and prevents a phenomenon in which a disturbing signal at the vicinity of a frequency of 2.4 GHz or in the frequency band of 2.5 GHz to 2.7 GHz generated when a transmission signal in the frequency band of 1.7 GHz is output from the high-frequency amplifier 30 is emitted from the antenna 7 to disturb a reception signal and a transmission signal in the frequency band of 2.4 GHz or the frequency band of 2.5 GHz to 2.7 GHz.

Furthermore, a duplexer 32 for a frequency of 2 GHz suppresses an external transmission signal in the frequency band of 1.4 to 1.5 GHz that originates in another mobile phone and enters from the antenna 7, and prevents a phenomenon in which a disturbing signal in the vicinity of the frequency band of 2.4 GHz to 2.5 GHz generated when a transmission signal at a frequency of 2 GHz is output from the high-frequency amplifier 30 is emitted from the antenna 7 to disturb a reception signal and a transmission signal in the frequency band of 2.4 GHz to 2.5 GHz. That is, the duplexer 32 prevents disturbing a wireless LAN reception signal/transmission signal at a frequency of 2.4 GHz and a reception signal/transmission signal in the frequency band of 2.5 GHz to 2.7 GHz according to the W-CDMA, TD-CDMA, TD-SCDMA or the like.

Furthermore, as for the addition of a wireless LAN function with respect to the frequency band of 2.4 GHz or the frequency band of 5 GHz, due to a large frequency difference, conventionally, the addition hardly could be realized using one high-frequency amplifier. However, according to this embodiment, it is possible to eliminate the need to provide a high-frequency amplifier for a wireless LAN with the frequency band of 2.4 GHz, which was necessary in a conventional case.

Although the foregoing description focused on the case of using the W-CDMA, not to mention, the same effects can be achieved in the cases of a CDMA mobile phone using a plurality of frequency bands and an apparatus shared in the W-CDMA and CDMA.

The high-frequency circuit device according to the present invention has an advantage that cost reduction (to one-third to one-fifth) and reduction in power consumption (about 20% decrease) can be achieved and an additional high-frequency amplifier is not required even when a transmission frequency band is newly added, and thus is useful for a W-CDMA mobile phone system using a plurality of frequency bands and a W-CDMA mobile phone using frequency bands of 800 to 900 MHz, 1.4 to 1.5 GHz, 1.6 to 1.8 GHz, 1.9 to 2.0 GHz, and 2.5 to 2.7 GHz. The high-frequency circuit device further is useful for a multifunctional mobile phone composed of a W-CDMA mobile phone as described above to which a wireless LAN function with respect to the frequency band of 2.4 GHz is added. The high-frequency circuit device even further is useful for a mobile phone to which the W-CDMA in the frequency band of 2.5 to 2.7 GHz, TD-CDMA or TD-SCDMA is added. The high-frequency circuit device still further is useful for a CDMA mobile phone using a plurality of frequency bands and a mobile phone shared in the W-CDMA, LAN and CDMA.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high-frequency circuit device that is conformable to a system in which a plurality of transmission frequency bands exist, comprising:
    a transmission amplifier circuit for transmitting high-frequency power from an antenna, which includes at least one high-frequency amplifier for a wide frequency band that amplifies signals in a plurality of transmission frequency bands differing by not less than 200 MHz from each other;
    a duplexer that is provided for performing simultaneous transmission/reception;
    upstream and downstream switch circuits in a direction of transmission that are provided so as to sandwich the duplexer between the high-frequency amplifier for a wide frequency band and the antenna and are switched on when the simultaneous transmission/reception is performed; and
    a power supply amplitude modulator that supplies an amplitude modulation voltage to a power supply terminal of the transmission amplifier circuit,
    wherein in the high-frequency amplifier of the transmission amplifier circuit, phase information of a transmission signal is supplied to a signal input terminal and the amplitude modulation voltage corresponding to amplitude information of the transmission signal is supplied from the power supply amplitude modulator to the power supply terminal so that polar modulation or polar loop modulation is performed.

2. The high-frequency circuit device according to claim 1, wherein the high-frequency circuit device is conformable to a Wideband-Code Division Multiple Access (W-CDMA) or Code Division Multiple Access (CDMA) system in which a plurality of transmission frequency bands exist.

3. The high-frequency circuit device according to claim 2, wherein the high-frequency amplifier of the transmission amplifier circuit comprises a gain-controllable driver amplifier.

4. The high-frequency circuit device according to claim 2, comprising a low-pass filter provided between the duplexer and the upstream switch circuit.

5. The high-frequency circuit device according to claim 2, wherein the high-frequency amplifier for a wide frequency band amplifies a signal in a transmission frequency band corresponding to a wireless Local Area Network (wireless LAN) specification and directly supplies the signal that has been amplified to the downstream switch circuit so that the high-frequency circuit device operates on a frequency band other than frequency bands according to the W-CDMA or CDMA.

6. The high-frequency circuit device according to claim 2, wherein the high-frequency amplifier for a wide frequency band amplifies a multi-carrier modulation signal in a transmission frequency band corresponding to an Orthogonal Frequency Division Multiplex (OFDM) system and directly supplies the multi-carrier modulation signal that has been amplified to the downstream switch circuit so that the high-frequency circuit device operates on a frequency band other than frequency bands according to the W-CDMA or CDMA.

7. The high frequency circuit device according to claim 2, wherein the transmission amplifier circuit comprises one high-frequency amplifier for a wide frequency band, and the high-frequency amplifier for a wide frequency band has a final amplification stage including a feedback circuit.

8. The high-frequency circuit device according to claim 1, wherein the high-frequency amplifier of the transmission amplifier circuit comprises a gain-controllable driver amplifier.

9. The high-frequency circuit device according to claim 1, comprising a low-pass filter provided between the duplexer and the upstream switch circuit.

10. The high-frequency circuit device according to claim 1, wherein the high-frequency amplifier for a wide frequency band amplifies a signal in a transmission frequency band corresponding to a wireless Local Area Network (wireless LAN) specification and directly supplies the signal that has been amplified to the downstream switch circuit so that the high-frequency circuit device operates on a frequency band other than said plurality of transmission frequency bands.

11. The high-frequency circuit device according to claim 1, wherein the high-frequency amplifier for a wide frequency band amplifies a multi-carrier modulation signal in a transmission frequency band corresponding to an Orthogonal Frequency Division Multiplex (OFDM) system and directly supplies the multi-carrier modulation signal that has been amplified to the downstream switch circuit so that the high-frequency circuit device operates on a frequency band other than said plurality of transmission frequency bands.

12. The high frequency circuit device according to claim 1, wherein the transmission amplifier circuit comprises one high-frequency amplifier for a wide frequency band, and the high-frequency amplifier for a wide frequency band has a final amplification stage including a feedback circuit.

* * * * *